United States Patent [19]

Mefford

[11] Patent Number: 4,573,007
[45] Date of Patent: Feb. 25, 1986

[54] DIGITAL TEST PROBE HAVING MEMORY FOR LOGIC LEVELS AT DIFFERENT TEST LOCATIONS

[75] Inventor: Joseph P. Mefford, Glen Cove, N.Y.

[73] Assignee: Harris Corporation, Melbourne, Fla.

[21] Appl. No.: 498,404

[22] Filed: May 26, 1983

[51] Int. Cl.[4] .................. G01R 19/155; G01R 1/067
[52] U.S. Cl. ..................................... 324/133; 324/111
[58] Field of Search ............... 324/133, 157, 72.5, 324/149, 111, 76; 364/900

[56] References Cited

U.S. PATENT DOCUMENTS

| | | | |
|---|---|---|---|
| 3,525,939 | 8/1970 | Cartmell | 324/72.5 X |
| 3,628,141 | 12/1971 | Union | 324/72.5 |
| 3,750,015 | 7/1973 | Sheker et al. | 324/72.5 |
| 3,838,339 | 9/1974 | Brandt | 324/133 |
| 3,959,791 | 5/1976 | Takahashi et al. | 324/133 X |
| 3,999,126 | 12/1976 | Gabor | 324/133 |
| 4,011,508 | 3/1977 | Gabor | 324/133 |
| 4,145,651 | 3/1979 | Ripingill, Jr. | 324/72.5 |
| 4,189,673 | 2/1980 | Shinataku | 324/72.5 X |
| 4,347,434 | 8/1982 | Kovalick | 324/72.5 X |

OTHER PUBLICATIONS

French, "Voltmeter With a Memory", Radio and Electronics Constructor, vol. 29, No. 1, pp. 23-25, Aug. 1975.

Primary Examiner—Reinhard J. Eisenzopf
Assistant Examiner—Warren S. Edmonds
Attorney, Agent, or Firm—Yount & Tarolli

[57] ABSTRACT

The digital test probe has an electrically conductive probe needle for making electrical contact with different test locations of a digital circuit. A logic level detector connected to the needle provides a data signal having a logic level representative of that at the test location. N indicators, such as light emitting diodes, are provided with each presenting an indication of the logic level at an associated one of N test location. A memory has N storage locations and each stores a binary level signal representative of the logic level at an associated one of N test locations. Each time the operator actuates a switch, data representing the logic level at that test location is written into an associated location in the memory. In this way, the operator need not divert his attention from the probing of test locations to look at the indicators while testing the various locations since the indicators will provide him with a visual readout after he has finished.

19 Claims, 20 Drawing Figures

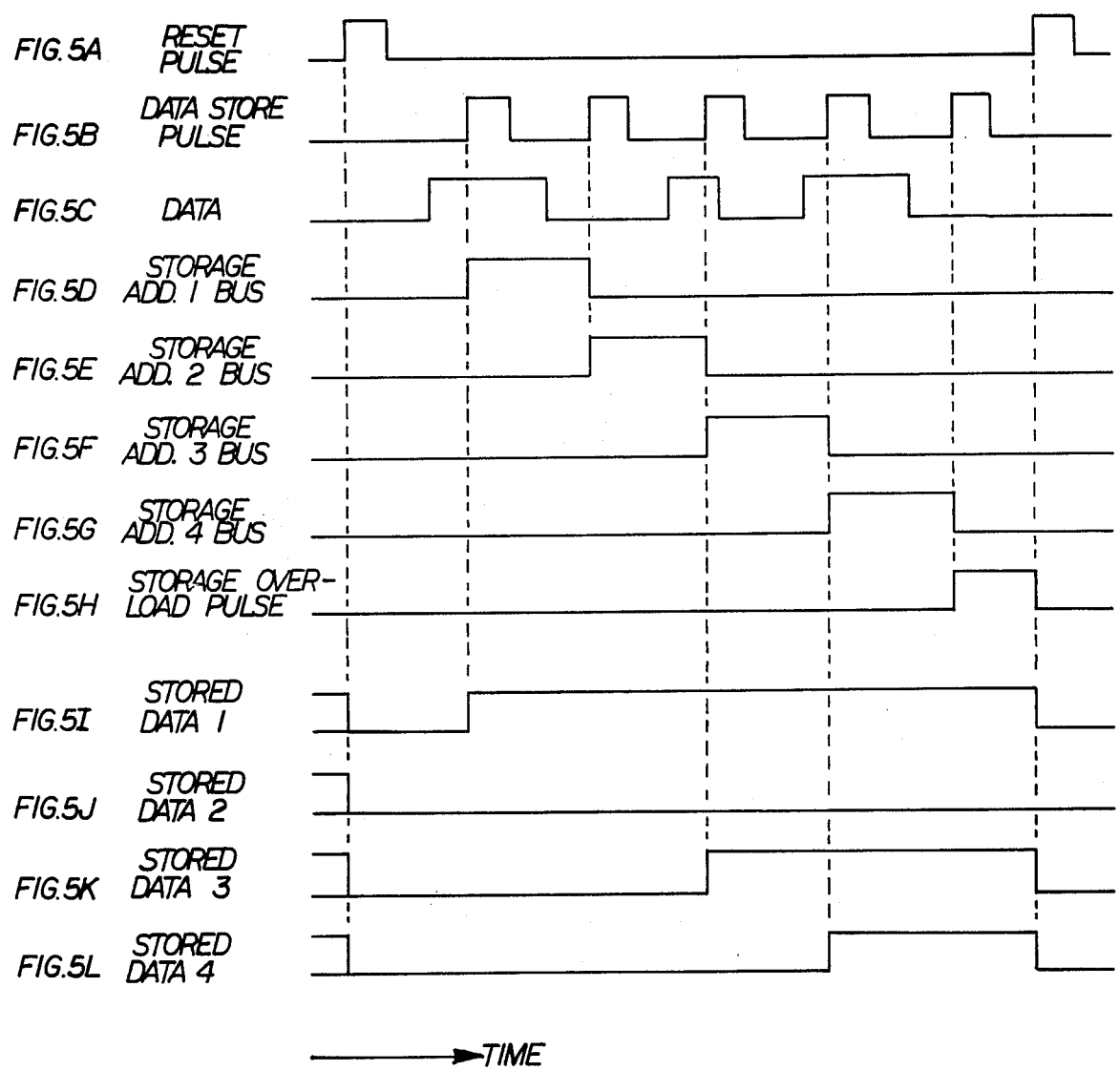

DIGITAL TEST PROBE HAVING MEMORY FOR LOGIC LEVELS AT DIFFERENT TEST LOCATIONS

BACKGROUND OF THE INVENTION

This invention relates to the art of digital testers for use in determining the logic level at different test locations of a digital circuit.

In testing digital circuits such as integrated circuits and the like, it is frequently desirable to determine the logic level, i.e., a binary "1" or a binary "0" level, at one or more test locations. Such logic probes are commercially marketed and examples of such test probes are found in the disclosures of U.S. Pat. Nos. 4,145,451 to A. E. Ripingill and 3,750,015 to R. N. Sheker. The prior art test probes disclosed in those patents are portable or hand held and serve the purpose to provide the operator with a visual indication as to the logic state at the circuit point being tested. However, such prior art does not provide a means of storing the test data for several test points. Consequently, if the logic states at various test points are to be remembered, the probe operator's attention must be diverted away from the probing tasking to recording test results. Each time he records a test result, additional time must be expended for the operator to re-orient himself to the probing task.

SUMMARY OF THE INVENTION

It is a primary object of the present invention to provide a test probe for determining logic levels at different test locations and to record and store data for subsequent viewing without the operator's attention being diverted from the probing task.

It is still a further object of the present invention to provide such a test probe requiring only one hand for operation.

It is a still further object of the present invention to provide such a test probe that remembers the logic level at each of a plurality of different locations of the digital circuit and provides a multistage visual readout in accordance therewith.

It is a still further object of the present invention to provide such a logic test probe having a plurality of location indicator means associated with a like plurality of logic level indicator means so that the pattern of logic levels displayed may be associated with their respective locations.

It is a still further object of the present invention to provide such a test probe wherein the location indicators present an output indicative of the last test location that was probed.

In accordance with one aspect of the present invention, the digital test probe includes an electrically conductive probe needle for making electrical contact with a test location of a digital circuit. N indicator means, such as light emitting diodes each serve to provide an indication of the logic level at an associated one of N test locations. A logic level detector is connected to the probe needle for providing a data signal having a logic level representative of that at a test location. A memory has N storage locations each storing a binary level signal indicative of the logic level at an associated one of the N test locations. Data entry circuitry serves to enter data into a storage location at an address thereof representative of the circuit location contacted by the needle.

In accordance with a still further aspect of the present invention, the data entry circuitry includes a switch actuated by an operator each time he desires to enter data representative of the binary level at the test location being probed.

Still further in accordance with the invention, each of the N indicator means provides an indication in accordance with the binary level of the signal stored in an associated storage location of the memory thereby displaying a pattern indicative of the logic levels existing at up to N test locations.

Still further in accordance with the invention, N location indicators each provide an indication that the associated test location was the last location that was probed.

BRIEF DESCRIPTION OF THE DRAWINGS

The foregoing and other objects and advantages of the invention will become more readily apparent from the following description of the preferred embodiment of the invention as taken in conjunction with the accompanying drawings which are a part hereof and wherein:

FIGS. 5A through 5L are waveforms illustrating voltage with respect to time of logic levels during the operation of the invention;

DESCRIPTION OF THE PREFERRED EMBODIMENTS

Figure 1:
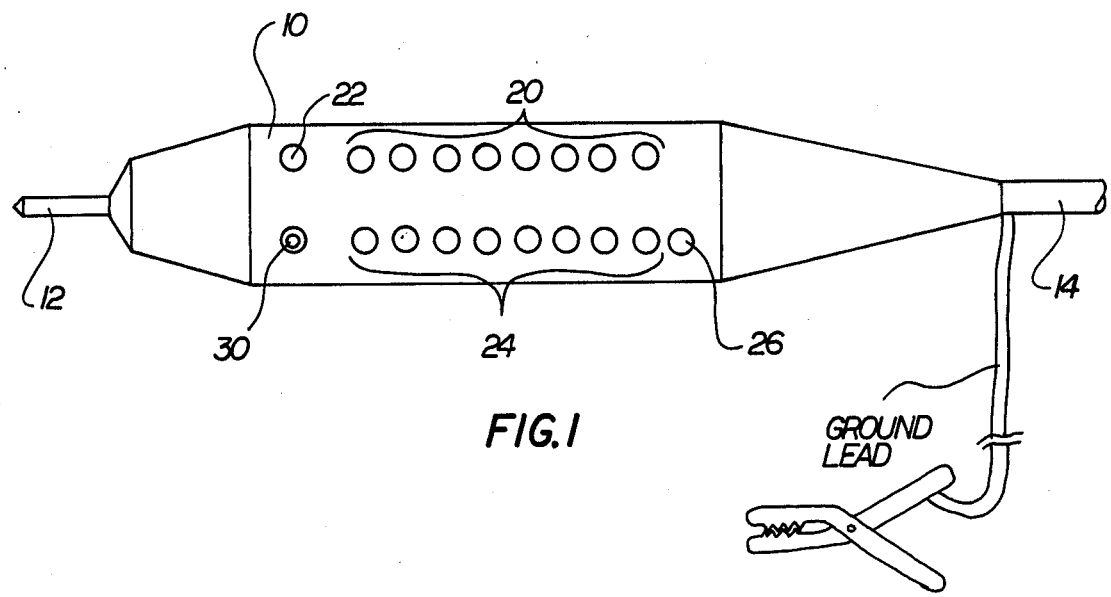
FIG. 1 is an elevational view illustrating the hand held test probe in accordance with the invention.

Referring now to the drawings and more particularly to FIG. 1 there is illustrated an elongated tubular housing forming the probe body 10 and from which there extends an elongated electrically conductive probe needle 12. The probe body 10 is of a size and shape so as to fit easily within an operator's hand so that it may be moved about a digital circuit utilizing the needle 12 to make electrical contact with different test locations thereof.

The probe body may be made of various materials such as an electrically nonconductive hollow plastic body within which there may be housed electrical circuitry together with one or more batteries for powering the electrical circuitry. In the embodiment illustrated, a flexible power cable 14 extends from one end and may be connected to a suitable power source for energizing circuitry contained within the probe body. Extending through the probe body so as to observed from the exterior thereof, there is provided a plurality of stored data indicators 20. Eight such indicators are illustrated in this embodiment and it is contemplated that each indicator take the form of a light emitting diode.

In addition to the eight stored data indicators 20, there is also provided a current data indicator 22, which is also preferably a light emitting diode, and which is to provide an indication of the logical level of the test point currently contacted by needle 12. Eight storage address indicators 24 are also located on the probe body and are each preferably a light emitting diode. These storage address indicators are located on the probe body so that each is associated with one of the stored data indicators 20. Thus, whenever one of the storage address indicators 24 is illuminated, the operator can look at the associated stored data indicator 20 to see a visual display of the logic level at that location. The storage address indicator that is illuminated will indicate to the operator that that location is the last for which data was obtained. In the embodiment illustrated only eight storage address indicators are provided for eight storage locations in an associated memory. Consequently, if for some reason, the operator attempted to enter additional data this will result in a memory overload indicator 26, also a light emitting diode, being illuminated. A reset push button 30 is also located on the housing so that it may be operated by the operator so as to reset the circuitry and extinguish all indicators.

The probe needle 12 in addition to providing an electrical contact with a test point also serves as a switch for signaling to associated circuitry that data representative of the logic level at the test point should be entered into memory. The operation of the test needle as a switch is more readily understood with reference to the schematic illustration in FIG. 2. The conductive needle 12 extends through two legs 30 and 32 of the U-shaped carrier 34 so as to slidably move along through the legs in the direction of the axis of the needle. The carrier 34 is fixed to the probe housing and the needle is carried between the legs of carrier 34 and is held in place against axial movement by means of a compression spring 36 which bears at one end against leg 32 and at the other end against a collar 38 which is fixed, as with a pin, to needle 12. In this way, the needle is constantly biased so as to protrude outwardly from the probe body and the spring resiliently resists inward movement of the needle. When the operator desires to record data, he depresses the needle 12 against the electrical circuit causing the needle to move axially inward against the resilient bias of spring 36. In this way, a mechanical coupling 40 extending from the free end of needle 12 within the probe housing turns a single pole double throw switch 43 from its normally off position 42 to an on position 44 to provide a switch closure. This, as will be seen hereinafter in FIG. 3, provides a data store pulse to the write circuitry for entering data into the memory as well toggling a counter to provide a new count indicative of a new test location.

Figure 2:
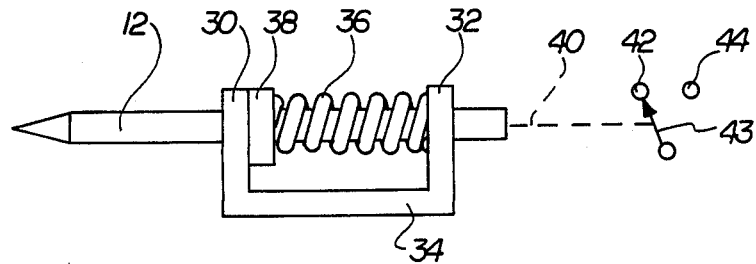
FIG. 2 is a schematic illustration showing the data storage switch of the probe needle.
Figure 3:
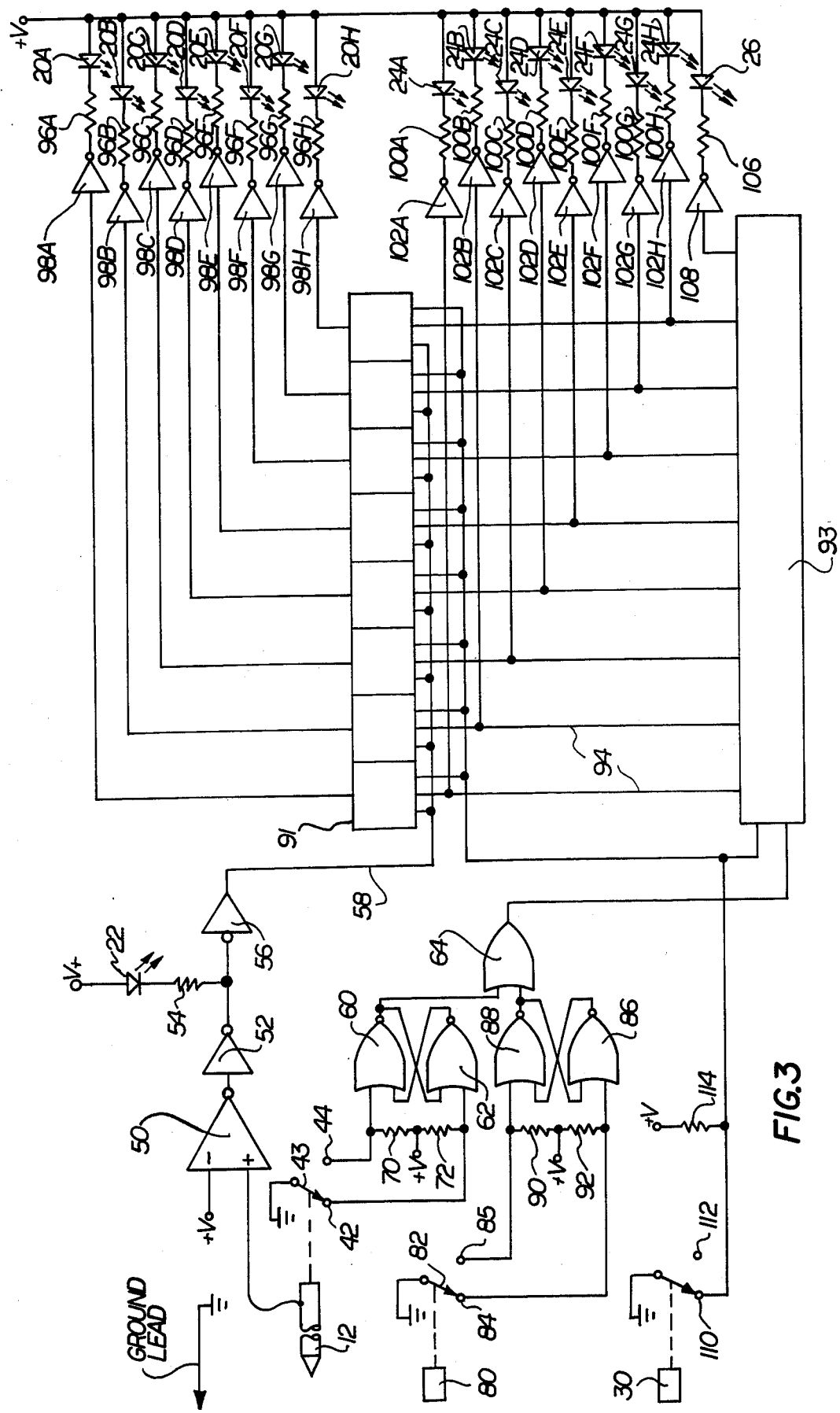
FIG. 3 is a combined schematic-block diagram illustration of the test probe circuitry.

Reference is now made to FIG. 3 which illustrates the circuitry employed in practicing the invention. When the needle 12 is positioned to electrically contact a test location of the digital circuit, the needle is in its extended position as is indicated in FIGS. 1 and 2 with the single pole double throw switch 43 being connected to contact position 42. This position is maintained until the operator depresses the probe to actuate the switch whereupon the pole makes contact with contact position 44.

Electrically, the needle 12 is connected to the positive or noninverting input of a voltage comparator 50 which may take the form of a conventional operational amplifier. The inverting or negative input of amplifier 50 is connected to a reference source $+V_1$. Consequently, if the voltage at the test point is a positive voltage and of a greater magnitude than the reference voltage $V_1$, the amplifier 50 will provide, at its output, a positive or binary "1" indication representative of the logic level at the test point.

Figure 4:
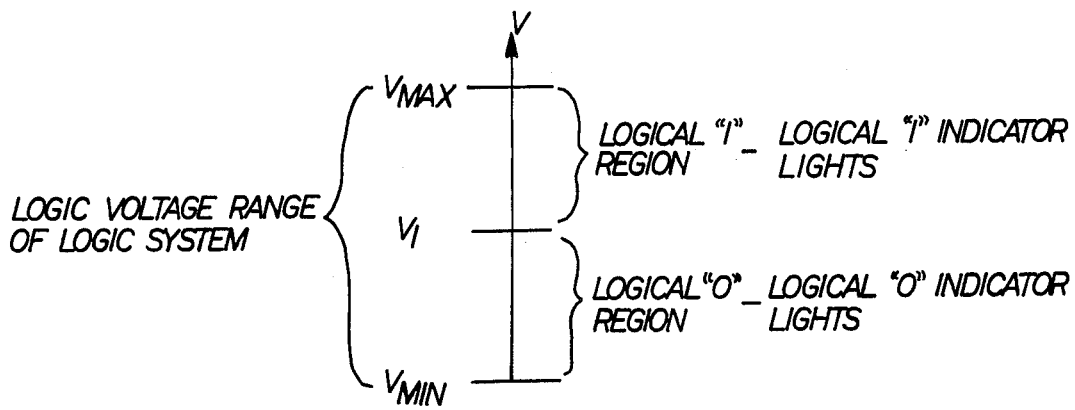
FIG. 4 is a graphical illustration of a portion of the operation of the test probe.

Reference may be made at this point to FIG. 4 which illustrates a waveform showing the manner of operation of the conductive needle and amplifier 50. So long as the voltage at the test point is less than the reference voltage $V_1$ then this is a logic "0" condition and an associated current data indicator will not be energized. On the other hand, if the voltage at the test point is a positive voltage greater than voltage $V_1$ this will be representative of a logic "1" condition and the associated current data indicator will be energized.

The output taken from amplifier 50 is inverted by means of an inverter 52. Consequently, if a binary "1" logic level is outputted from the amplifier 50 the inverter will provide a grounding effect so that current may flow from the positive voltage source through the light emitting diode 22 and a limiting resistor 54 to energize the indicator. This provides the operator with an indication that the current data is representative of a binary "1" condition. This signal is then inverted by another inverter 56 and is supplied to a data bus 58 so that data may be written into an appropriate storage portion in a memory.

Whenever the operator desires to enter the data on the data bus 58 for storage in the memory he depresses the probe needle 12 so as to displace the pole of switch 43 from switch position 42 to switch position 44. This places a ground potential at one input of the NOR gate 60 which is connected with a second NOR gate 62 to define a bistable multivibrator or flip-flop. This causes the output of the flip-flop to change from a binary "0" condition to a binary "1" condition. This binary "1" signal outputted from the flip-flop will then be passed by an OR gate 64 so as to supply a data store command pulse to the circuitry which will cause the data on the data bus 58 to be stored in memory. When the probe switch is relaxed the needle 12 will move forward returning the switch pole 43 back to its original condition at switch position 42. This will cause a binary zero signal to be supplied to one input of an OR gate 62 and the flip-flop will revert to its previous condition wherein the output signal is at a binary zero level. A divider circuit, including resistors 70 and 72, is connected between the inputs to NOR gates 60 and 62 as shown with the midpoints of these resistors being connected to a positive voltage supply source. Thus it is seen that the actuation of the needle by the operator to momentarily cause pole 43 to engage contact position 44 will provide a binary one pulse by way of OR gate 64.

An alternative circuit for providing the data store command pulse is also illustrated in the circuitry of FIG. 3. This contemplates that a data store push button 80 is mounted on the probe body 10 and is accessible to the operator, as by using his thumb, to momentarily actuate the push button. This push button, in a manner similar to needle 12, is spring biased so that a single pole double throw switch has its single pole 82 normally in the position as shown connecting ground to contact position 84. This supplies a binary "0" signal to one input of a NOR gate 86 which is connected to a second NOR gate 88 in a manner to define a bistable multivibrator or flip-flop. The output of the flip-flop is at a binary "0" condition prior to actuation of the switch because the second switch contact position 85 is open circuited permitting a positive or binary "1" signal to be supplied from the positive voltage source through a resistor 90 to one input of NOR gate 88. A second resistor 92 connects the positive voltage by to one input of NOR gate 86. However, this input has been grounded by the normal position of pole 82 in contact with contact position 84. However, once the data store push button has been momentarily actuated so as to momentarily cause pole 82 to engage contact position 85 the flip-flop will change state causing a momentary binary "1" signal to be supplied through the OR gate 64 to provide a data store command pulse. It is to be appreciated that the operator has a choice, where both functions are provided, to either enter data by actuating the probe needle switch or by utilizing the data store push button.

Binary level data on the data bus 58 is supplied to each of eight storage locations in a memory 91. This memory may take the form of eight flip-flops or eight stages of a register each having the capability of storing a binary "1" or a binary "0" signal. The data bus 58 is connected to each input of the eight storage units. However, the unit that receives the data for storage therein will be that which is addressed by a counter decoder circuit 93. This is a ten stage decoder for counting from zero through nine and on each count it provides an output signal from one of eight output lines 94 for addressing or enabling an associated storage unit of memory 91. The counter is incremented each time it receives a data store pulse from OR gate 64 so as to increment its count by one. The eight address lines or buses 94 are arranged such that only one will carry an enabling or binary "1" signal for addressing one of the storage units in dependence upon the count status of the counter decoder 93. Thus, on a count of one the first address line will carry a positive or binary "1" signal for enabling storage unit one of memory 91 which permits that storage unit to receive the binary level signal on the data line 58. If, for example, this is binary "0" signal then a binary "0" signal will be written into that storage unit of the memory. The next time the operator positions the probe so as to make contact with a circuit point and then presses either the data store push button 80 or the needle 12 a data store pulse will be supplied to increment the counter 93 so that its second address line will carry a binary "1" signal to enable storage unit 2 of memory 91 and that storage unit will have written into it a binary level signal in dependence upon the data on the data line 58. Thus, it is seen that each time the operator wants to store data representative of the test results he momentarily actuates either the data store push button or the probe needle 12.

The storage data indicators 20 are each associated with one of the storage units of memory 91. As shown in FIG. 3, each storage unit has an output which is inverted by an inverter and is connected by a resistor to one of the storage data indicators 20. Thus, as shown in FIG. 3, the position one indicator takes the form of a light emitting diode 20A which is connected to the first storage unit of memory 91 by way of a resistor 96A and an inverter 98A. Consequently, it is seen that whenever the binary level in storage unit one of memory 91 is in a binary "1" condition, this signal level will be inverted by the inverter 98A to cause indicator 20A to be energized providing an indication of that binary condition. Likewise, if the binary level in storage unit 1 is of binary "0" level, then this condition is inverted by the inverter 98A and indicator 20A is extinguished indicative of a binary zero level. The circuits containing indicators 20B through 20H are connected and operate in the same manner as that discussed for indicator 20A.

Each of the storage address indicators 24 preferably takes the form of a light emitting diode which is connected in a series circuit from the positive voltage supply source to one of the address lines 94 associated with one of the storage units in memory 91.

Thus, for example, the light emitting diode indicator 24A is connected in a series circuit from the positive voltage supply source to the address line 94 for storage unit 1 of memory 91 by way of a resistor 100A and an inverter 102A. Consequently, whenever the counter is addressing the first storage unit it raises its address line to that storage unit and this, being a positive signal, will be inverted by the inverter 102A so as to permit indicator 24A to become energized which indicates that this is the last address for data that has been entered into the memory 91. Similarly, address indicators 24B through 24H are connected in series with a resistor and an inverter to one of the associated address lines, as is shown in FIG. 3.

In the embodiment illustrated, the memory is capable of storing only eight logic levels associated with eight different locations of a test circuit. This was chosen as it is the typical number of binary bits employed in a byte. Obviously, the capacity may be increased and in such case a larger counter decoder would be employed. In the embodiment illustrated if the operator attempts to store more than eight logic levels the storage overload indicator 26 will be energized. Thus, in the last count position of the counter decoder 93 there is provided a circuit which includes the storage overload indicator 26 in the form of a light emitting diode. The circuit includes the indicator 26, a resistor 106 and an inverter 108. Upon an overload condition, the last stage of the counter decoder will provide a binary "1" or a positive output signal which will be inverted by the inverter 108 causing the storage overload indicator 26 to be energized.

The counter decoder may be reset to a count of zero and the memory storage units may each be set to a binary "0" level by the operator momentarily depressing a reset switch button 30 (see FIG. 1). As shown in FIG. 3, when the reset button is depressed, it momentarily displaces the single pole of the double throw switch from switch position 110 to a switch position 112 thereby momentarily removing a ground potential and substituting an open circuit. This permits a positive voltage pulse to be transmitted by way of resistor 114 to the reset input of memory 91 and to the counter-decoder 92. The unit is now conditioned to commence another cycle of operation.

Reference is now made to the waveforms illustrated in FIG. 5A through FIG. 5L. In the waveform of FIG. 5A, it is seen that a reset pulse will reset the counter-decoder whereupon a binary "0" level is stored at each stage of memory 90. Whenever the operator actuates the needle switch or the data store push button switch, a data store pulse is provided as shown in FIG. 5B. Consequently, the binary level of the data on data line 58 is determined and will be stored in a first storage location as indicated by waveforms of FIGS. 5C, 5D and 5I. The address indicators will remain lit only until the next store pulse is entered as is indicated by the waveforms of FIGS. 5D through 5G. However, the logic state of each memory portion will be remain displayed by the stored data indicators 20 as is indicated by the waveforms of FIGS. 5I through 5L.

Figure 6:
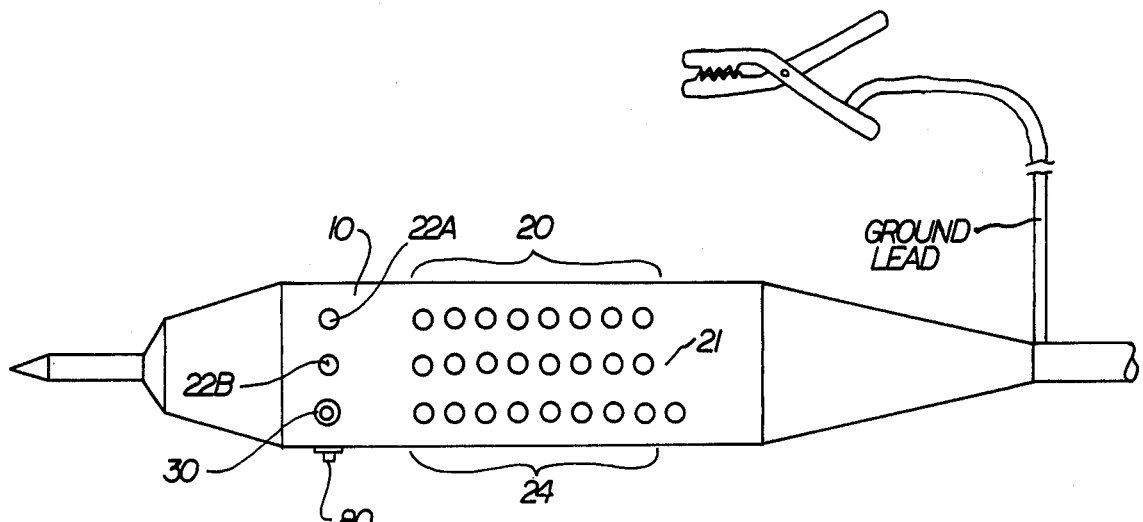
FIG. 6 is an elevational view similar to that of FIG. 1 but showing a second embodiment of the invention.

Reference is now made to FIG. 6 which illustrates another embodiment of the invention wherein the probe body is additionally equipped with a data store push button switch 80 and a second group of storage indicators. To facilitate this description like components in FIG. 1 will be identified in FIG. 6 with like character references. Thus, the probe body 10 is provided with stored data indicators 20, storage address indicators 24, and a reset push button switch 30. However, in the embodiment of FIG. 6 instead of only one current indicator as the embodiment of FIG. 1 it includes a current binary "1" level indicator 22A and a current binary "0" level indicator 22B so as to give the operator a visual display as to whether the test point exhibits a logic "0" level or a logic "1" level. Additionally, the stored data indicators includes a second group of data indicators 21 which serve as binary "0" level indicators with the indicators 20 serving as binary "1" level indicators. Again, each of these data indicators is associated with one of the storage address indicators 24 so that the operator may easily determine which is the last location that data was entered into.

Figure 7:
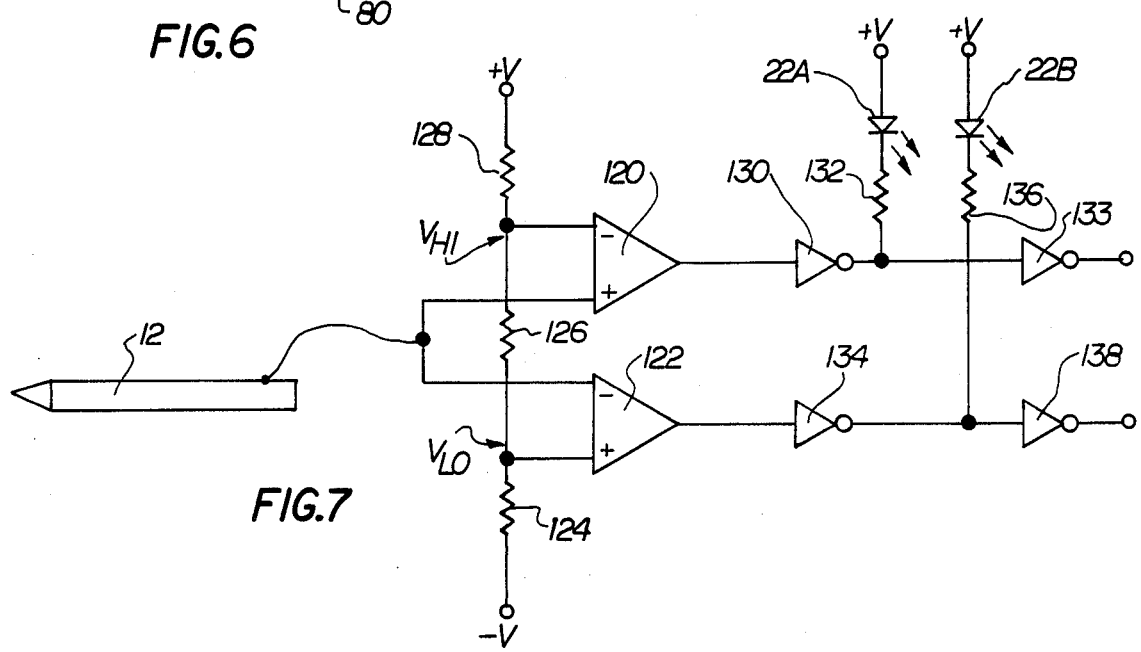
FIG. 7 is a schematic illustration showing a portion of the circuitry for use in conjunction with the embodiment of FIG. 6.
Figure 8:
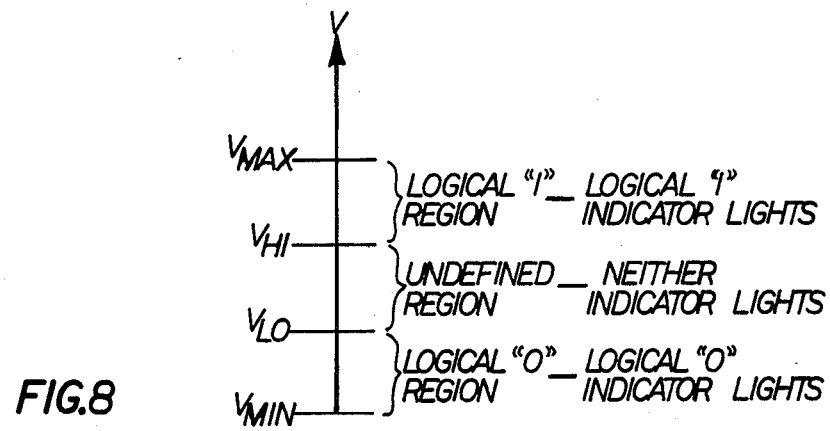
FIG. 8 is a graphical illustration of a portion of the operation of the circuitry of FIG. 7.

Referring now to FIG. 7, there is illustrated a schematic circuit similar to that illustrated in the upper left hand portion of FIG. 3 for use with the embodiment of FIG. 6. Here the conductive needle 12 has its ouput connected to the noninverting input of a voltage comparator amplifier 120 as well as to the inverting or negative input of a second voltage comparator amplifier 122. A high reference voltage $V_{H1}$ supplied to the negative input of the amplifier 120 whereas a low reference $V_{LO}$ is supplied to the positive or noninverting input of amplifier 122. A positive +V and a negative −V voltage are connected at opposite ends of a series resistance circuit including resistors 124, 126 and 128 so as to establish the two reference voltages. Thus, with reference to FIG. 8 whenever the voltage at the circuit point being tested is greater than the high reference level indicative of a logical one condition then amplifier 120 produces a positive signal which is inverted by inverter 130 causing the logical one indicator 22A to be illuminated through resistor 132. The output of inverter 130 is again inverted by inverter 133 for application to a data bus for application to a multistage memory such as that illustrated in FIG. 3. Whenever the signal voltage is between the high level reference and the low level reference neither indicator 22A or 22B will be energized. Whenever the signal voltage at the test point is lower than the low reference level then the output of amplifier 122 will be positive and this is inverted by an inverter 134 causing indicator 22B to be energized by a resistor 136. The output of inverter 134 is again inverted by an inverter 138 for application to a data store which may be essentially a duplicate of that of memory 91 but used for the binary zero signal levels. In this embodiment, the address circuitry may take the form as shown in FIG. 3.

Figure 9:
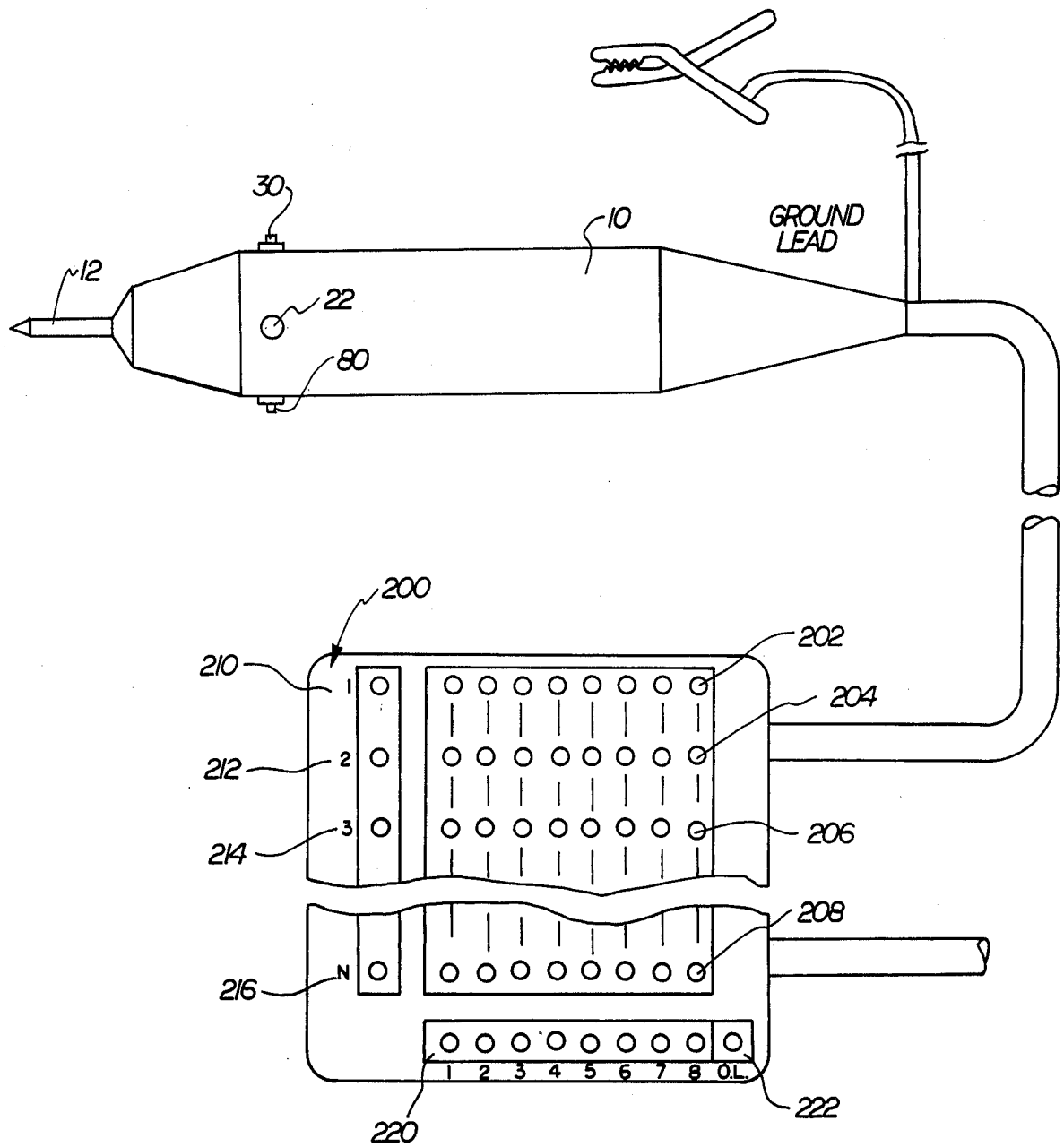
FIG. 9 is a view similar to that of FIGS. 1 and 6 showing a third embodiment of the present invention.

Reference is now made to FIG. 9 which illustrates a third embodiment of the invention which is particularly applicable in situations wherein a need arises to store and display more data than that which can be physically displayed on the probe body 10 of FIG. 1. Due to the limited size of the probe body 10 of FIG. 1 the number of stored data indicators 20 that may be located on the probe may not be adequate for some storage tasks. In such case, the stored data indicators 20 as well as the storage address indicators 24 may be located in a housing separate from that of the probe body. With reference to FIG. 9 a separate housing 200 is shown which is provided with several rows of stored data indicators including rows 202, 204, 206 and 208. Row 208 may be the Nth row of a plurality of rows 1 through N. Each row includes eight indicators forming an eight bit byte of information. To the left of the stored data indicators is provided a column of byte storage address indicators including indicators 210, 212, 214 and 216. Indicator 216 is associated with the Nth row of indicators 208. Located immediately below row 208 there is provided a row of eight bit storage address indicators 220 arranged similar to the address indicators 24 of FIG. 1. That is each of the bit storage address indicators 220 is associated with one bit of the N rows of stored data indicators immediately thereabove. Additionally, this row of address indicators includes a storage overload indicator 222 which serves the same purpose as the storage overload indicator 26 in FIG. 1.

It is contemplated that the circuitry may be mounted within the probe body 10 or within housing 200 as desired and operates in the same fashion as that described hereinbefore. The probe body is constructed similar to the embodiment of FIG. 1 and includes a reset push button 30, a current data indicator 22 and a data store push button 80. In this embodiment, the data to be stored may be organized in digital words or bytes which are eight bits in length. The stored data indicators are activated sequentially as in the case discussed with the embodiment of FIG. 1. It is contemplated that the storage address indicators will indicate the latest storage address used by means of a matrix; that is, the first column may indicate the word or byte containing the last bit stored and row 220 indicates the bit within the word or byte. This then permits fewer storage address indicators to be used for the same amount of information than that in the embodiment of FIG. 1.

While the invention has been described in conjunction with preferred embodiments, it is to be appreciated that various modifications may be made without departing from the spirit and scope of the invention as defined by the appended claims.

What is claimed is:

1. A digital test probe for determining logic levels at different test locations of a digital circuit comprising:
    an electrically conductive probe needle for making electrical contact with a said test location;
    logic level detection means connected to said needle for providing a data signal having a logic level representative of that at a said test location contacted by said needle;
    memory means having N storage locations each for storing a binary level signal indicative of the logic level at an associated one of N said test locations;
    N stored data indicator means coupled to said memory means for providing indications of the logic levels at associated ones of said N test locations;
    N location indicator means respectively associated with said N stored data indicator means for use in associating the binary level of the stored data with a test location; and
    data entry means, for entering each said data signal for storage in a storage location of said memory means associated with one of said N test locations.

2. A digital test probe as set forth in claim 1 wherein said data entry means includes addressing means for sequentially addressing each of said N storage locations of said memory means in response to sequentially provided data store pulses for sequentially entering N data signals in respective ones of said N storage locations.

3. A digital test probe as set forth in claim 2 including manually operable means for supplying said data store pulses to said data entry means.

4. A digital test probe as set forth in claim 3 wherein said means for providing said data store pulses includes switch means adapted to be operated by an operator for providing a said data store pulse.

5. A digital test probe as set forth in claim 3 wherein said electrically conductive probe needle is mounted within a probe body housing and spring biased therein so that when said needle is depressed against the test circuit it retracts within the probe body and switch means within said probe body operably connected to said needle for providing a said data store pulse each time said needle is depressed into said probe body.

6. A digital test probe as set forth in claim 1 wherein each of said stored data indicator means is connected to an associated one of said memory storage locations for providing a visual indication in dependence upon the binary level signal stored therein.

7. A digital test probe as set forth in claim 1 including a remote housing separate from but electrically connected to said probe needle, said stored data indicators being mounted on said remote housing.

8. A digital test probe as set forth in claim 1 wherein said data entry means includes addressing means for individually addressing each said location of said memory means for entering data for storage therein representative of the binary level of said data signal.

9. A digital test probe as set forth in claim 8, wherein said addressing means includes a counter for counting N data store pulses and having N outputs for respectively addressing one of said N storage locations in dependence upon the count therein.

10. A digital test probe as set forth in claim 9 including N indicator means each connected to one of said N outputs of said counter for providing a visual indication dependent upon the count therein so as to thereby indicate the last memory location for which data was entered into said memory means.

11. A digital test probe as set forth in claim 9 including means for periodically supplying a data store pulse for application to said binary counter to increment the count therein.

12. A digital test probe as set forth in claim 11 wherein said data store pulse supplying means includes manually operable switch means for supplying a said data store pulse each time the operator desires to enter said data signal for storage in said memory means.

13. A digital test probe for use in determining logic levels at various test locations of digital circuit, comprising:

an elongated probe housing suitably configured to be held by one hand of an operator;

an electrically conductive probe needle extending from one end of said housing for making electrical contact with test locations of said digital circuit;

binary level detection means connected to said needle for providing a data signal having a binary level representative of that at a said test location contacted by said needle;

data storage means for storing N said data signals and including a multistage register having N addressable stages each for storing data representative of the binary level at an associated one of N said test locations;

N data stored indicator means each coupled to an associated one of said register stages for providing a visual indication of the binary level of the data signal stored therein;

N address location indicator means coupled to said counter means and responsive thereto such that one of said location indicator means will be energized to provide a visual display in accordance with the count in said counter means; and data entry means for entering each said data signal for storage in said register at a location of said addressable stages associated with one of said test locations.

14. A digital test probe as set forth in claim 13 wherein said data entry means includes means for sequentially addressing said N stages of said register in sequence with the provision of N said data signals from testing at N said test locations.

15. A digital test probe as set forth in claim 14 wherein said data entry means includes manually operable switch means for providing a data store pulse each time it is desired to enter a data signal for storage.

16. A digital test probe as set forth in claim 15, wherein said addressing means includes counter means responsive to each said data store pulse for addressing one of said register stages in dependence upon the count therein for entering data in the addressed register stage.

17. A digital test probe as set forth in claim 13, wherein said N data stored indicator means are mounted on said probe housing so as to be visually observable from the exterior thereof.

18. A digital test probe as set forth in claim 17, wherein said N stored data indicator means and said N address location indicator means are mounted on said probe housing so as to be visually observable from the exterior thereof.

19. A digital test probe as set forth in claim 18 wherein said stored data indicator means and said address location indicator means are arranged such that each location indicator means is physically associated with one of said data indicator means.

* * * * *